United States Patent
Lu et al.

(10) Patent No.: US 6,740,471 B1
(45) Date of Patent: May 25, 2004

(54) PHOTORESIST ADHESION IMPROVEMENT ON METAL LAYER AFTER PHOTORESIST REWORK BY EXTRA $N_2O$ TREATMENT

(76) Inventors: Gau-Ming Lu, 121 Park Ave. Rd. 3, Science-Based Industrial Park, Hsin-Chu (TW); Dowson Jang, 121 Park Ave. Rd. 3, Science-Based Industrial Park, Hsin-Chu (TW); Wen-Han Hung, 121 Park Ave. Rd. 3, Science-Based Industrial Park, Hsin-Chu (TW); Yeong-Rong Chang, 121 Park Ave. Rd. 3, Science-Based Industrial Park, Hsin-Chu (TW)

( * ) Notice: Subject to any disclaimer, the term of this patent is extended or adjusted under 35 U.S.C. 154(b) by 124 days.

(21) Appl. No.: 10/101,658

(22) Filed: Mar. 20, 2002

(51) Int. Cl.[7] .................................................. G03F 7/42

(52) U.S. Cl. ........................................ 430/311; 430/329

(58) Field of Search ................................ 430/311, 313, 430/314, 317, 318, 329

(56) References Cited

U.S. PATENT DOCUMENTS

| | | | |
|---|---|---|---|
| 4,330,569 A | 5/1982 | Gulett et al. | 427/38 |
| 5,714,037 A | 2/1998 | Puntambekar et al. | 156/643.1 |
| 5,795,821 A | 8/1998 | Bacchetta et al. | 438/624 |
| 6,096,662 A | 8/2000 | Ngo et al. | 438/798 |
| 6,143,666 A | 11/2000 | Lin et al. | 438/725 |
| 6,143,670 A | 11/2000 | Cheng et al. | 438/780 |
| 6,153,512 A | 11/2000 | Chang et al. | 438/624 |

*Primary Examiner*—Kathleen Duda
(74) *Attorney, Agent, or Firm*—George O. Saile; Stephen B. Ackerman; Stephen G. Stanton

(57) ABSTRACT

A method of improving photoresist adhesion in a reworked device, including the following steps. A semiconductor structure having an upper exposed metal layer is provided. An ARC layer is formed over the upper exposed metal layer. The ARC layer having an upper surface. A first photoresist layer is formed upon the ARC layer. The first photoresist layer is removed by a rework process. The ARC layer upper surface is roughened to form a roughened ARC layer upper surface. A second photoresist layer is formed upon the roughened ARC layer upper surface whereby adhesion of the second photoresist layer to the ARC layer is improved.

28 Claims, 2 Drawing Sheets

0.18 LOGIC

| SPLIT CONDITION | 1 | 2 | 3 | 4 | 5 | 6 | 7 | 8 | 9 | 14 | 15 | 16 | 17 | 18 | 19 |
|---|---|---|---|---|---|---|---|---|---|---|---|---|---|---|---|
| A | X | X | X | | | | | | | | | | | | |
| B | | | | X | X | X | | | | | | | | | |
| C | | | | | | | X | X | X | | | | | | |
| D | | | | | | | | | | X | X | X | | | |
| E | | | | | | | | | | | | | X | X | X |
| YIELD TILE (%) | 98.1 | 100 | 94.3 | 98.1 | 98.1 | 96.2 | 94.3 | 98.1 | 98.1 | 22.6 | 7.5 | 90.5 | 56.6 | 94.3 | 98.1 |

A: PRS + Mattson (90C) + DIW + N2O treatment (20")
B: PRS + Mattson (90C) + DIW + N2O treatment (40")
C: PRS + Mattson (90C) + DIW + N2O treatment (60")
D: PR wash + Mattson (90C) + PRS
E: PRS + Mattson (90C) + DIW NO REWORK:   AFM (Center): 7.48   AFM (Right): 8.38
PRS + PRS:   AFM (Center): 4.48   AFM (Right): 4.06

*FIG. 4*

PHOTORESIST ADHESION IMPROVEMENT ON METAL LAYER AFTER PHOTORESIST REWORK BY EXTRA $N_2O$ TREATMENT

FIELD OF THE INVENTION

The present invention relates generally to semiconductor fabrication and more specifically to a method of improving the adhesion of photoresist after reworking.

BACKGROUND OF THE INVENTION

During fabrication of semiconductor integrated circuit (IC) devices, it may become necessary to rework, or remove and reapply, metal photoresist. However, metal photoresist rework leads to yield loss due to the reapplied photoresist peeling inducing metal shorting. This is especially true for 0.18 μm logic products.

U.S. Pat. No. 6,143,666 to Lin et al. describes a method for forming a via through a dielectric layer within a microelectronics fabrication. A silicon oxide dielectric layer is formed over a substrate and is then treated with an oxygen plasma to enhance adhesion to a photoresist layer formed over the oxygen plasma treated silicon oxide dielectric layer.

U.S. Pat. No. 6,143,670 to Cheng et al. describes a method for forming a composite dielectric layer with enhanced adhesion upon a substrate by treating with ion implantation methods.

U.S. Pat. No. 6,096,662 to Ngo et al. describes a method of manufacturing a semiconductor device with improved adhesion between the local interconnect etch stop layer and the thermal oxide in an isolation region.

U.S. Pat. No. 5,714,037 to Puntambekar et al. describes methods for improving adhesion between various materials utilized in the fabrication of integrated circuits. In one method, the surface of a silicon dioxide (oxide) layer is treated with a nitrogen plasma in a reactive ion etching process prior to depositing a silicon nitride film upon the treated oxide layer.

U.S. Pat. No. 4,330,569 to Gulett et al. describes a method of conditioning a nitride surface by treating it with ionized oxygen.

U.S. Pat. No. 6,153,512 to Chang et al. describes a process to improve adhesion of hydrogen silsesquioxane (HSQ) MD layer to underlying materials. A series of plasma treatments performed in a nitrogen containing ambient are used to improve the adhesion of the hydrogen silsesquioxane (HSQ) IMD layer.

U.S. Pat. No. 5,795,821 to Bacchetta et al. describes a method for improved adhesion between dielectric materials at their interface by interposing a thin oxide layer between a first and second dielectric layer.

SUMMARY OF THE INVENTION

Accordingly, it is an object of the present invention to provide a method of improving adhesion between an inorganic anti-reflective coating (ARC) layer and photoresist after a metal photoresist rework Other objects will appear hereinafter.

It has now been discovered that the above and other objects of the present invention may be accomplished in the following manner. Specifically, a semiconductor structure having an upper exposed metal layer is provided. An ARC layer is formed over the upper exposed metal layer. The ARC layer having an upper surface. A first photoresist layer is formed upon the ARC layer. The first photoresist layer is removed by a rework process. The ARC layer upper surface is roughened to form a roughened ARC layer upper surface. A second photoresist layer is formed upon the roughened ARC layer upper surface whereby adhesion of the second photoresist layer to the ARC layer is improved.

BRIEF DESCRIPTION OF THE DRAWINGS

The present invention will be more clearly understood from the following description taken in conjunction with the accompanying drawings in which like reference numerals designate similar or corresponding elements, regions and portions and in which:

FIG. 4 is a chart illustrating the results of experiments conducted using the method of the present invention compared to the current method.

DETAILED DESCRIPTION OF THE PREFERRED EMBODIMENT

Unless otherwise specified, all structures, layers, steps, methods, etc. may be formed or accomplished by conventional steps or methods known in the prior art.

Problem Discovered by the Inventors

The inventors have discovered that photoresist peeling inducing metal shorting occurs during the current 0.18 μm logic metal layer photoresist rework procedure (as noted above) because of poor adhesion between the inorganic silicon oxynitride (SiON) anti-reflective coating (ARC) layer and the photoresist after the metal photoresist rework. The current 0.18 μm logic metal layer photoresist rework procedure uses a PRS tool (with an ACT solvent treatment)+ Mattson(90C plasma dry ashing)+deionized water(DIW).

The Preferred Embodiment of the Present Invention

The inventors have discovered that by including an additional treatment of the exposed ARC layer during the metal photoresist rework process that roughens the surface of the ARC layer, adhesion between the treated SiON ARC layer and the reapplied photoresist is dramatically improved. This reduces/avoids yield loss by metal shorts otherwise due to the peeling of the reapplied photoresist.

Initial Structure

Figure 1:
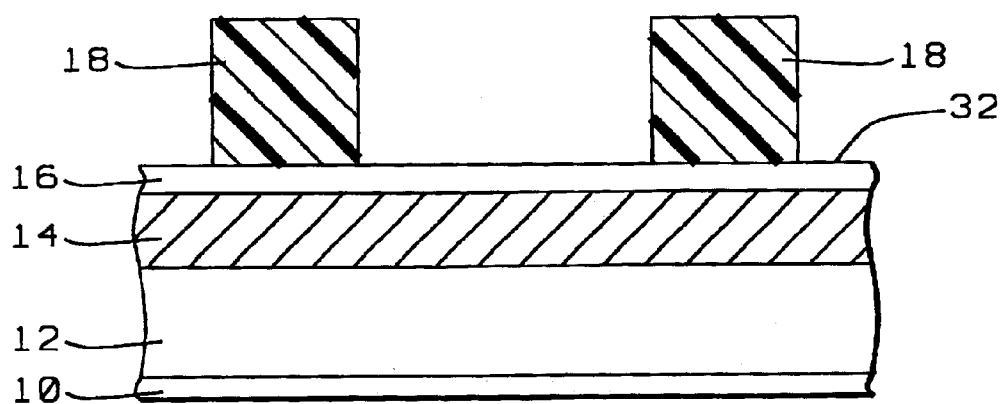
FIGS. 1 to 3 illustrate a preferred embodiment of the present invention.

As shown in FIG. 1, semiconductor structure 10 includes an overlying dielectric layer 12. Semiconductor structure 10 is also understood to possibly include a semiconductor wafer or substrate, active and passive devices formed within the wafer, conductive layers and dielectric layers (e.g., interpoly oxide (IPO), intermetal dielectric (IMD), etc.) formed over the wafer surface. The term "semiconductor structure" is meant to include devices formed within a semiconductor wafer and the layers overlying the wafer.

Dielectric layer 12 is preferably formed of silicon oxide ($SiO_2$ or oxide).

Metal layer 14 is formed over dielectric layer 12 and may be a metal 1, metal 2 or metal 3 layer, for example. Metal layer 14 may be composed of copper, aluminum, titanium (Ti) or TiN.

A bottom anti-reflective coating (ARC) layer 16 is formed over metal layer 14 to a thickness of preferably from about 100 to 1000 Å and more preferably about 200 to 600 Å. ARC layer 16 having an upper exposed surface 32.

ARC layer 16 is preferably formed of SiON, SiN, TiN or SiO$_2$ and is more preferably formed of SiON.

First metal photoresist layer 18 is formed over ARC layer 16. First metal photoresist layer 18 may be patterned as shown. Due to any number of problems with first patterned metal photoresist layer 18, it must be removed (by reworking) and another (patterned) metal photoresist layer 30 reapplied.

Removal of First Patterned Metal Photoresist Layer 18 (Rework)

Figure 2:
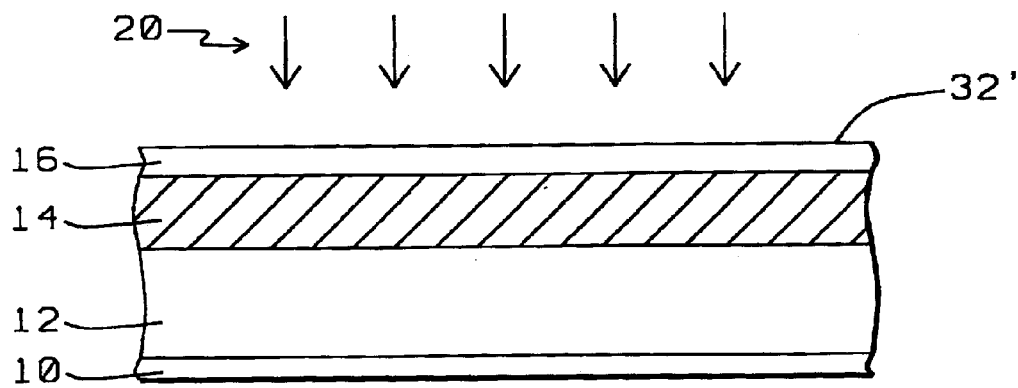

As shown in FIG. 2, first patterned metal photoresist layer 18 is removed by a rework process as is known to one skilled in the art, for example by the sequential steps:

a PRS using an ACT solvent treatment;

a Mattson asher using a plasma dry ashing at a temperature of about 90° C.; and a deionized water (DIW) treatment.

Roughening of ARC Layer 16 Surface 32

In a key step of the invention, exposed surface 32 of ARC layer 16 is roughened 20 that creates roughened ARC layer surface 32'. The ARC surface 32 roughening 20 is conducted preferably with N$_2$O gas at the following parameters:

(1) an N$_2$O gas flow of preferably from about 500 to 3000 sccm and more preferably from about 1200 to 2000 sccm;

(2) a temperature of preferably from about 350 to 450° C. and more preferably from about 380 to 420° C.;

(3) a pressure of preferably from about 1 to 15 Torr and more preferably from about 2 to 8 Torr; and (4) for a time of from about 20 to 100 seconds and more preferably from about 20 to 60 seconds.

The inventors have discovered that by roughening the surface 32 of ARC layer 16 to create roughened ARC layer surface 32', the adherence of subsequently formed reapplied photoresist layer/patterned photoresist layer 30 is substantially improved.

Formation of Second Patterned Metal Photoresist Layer 30

Figure 3:
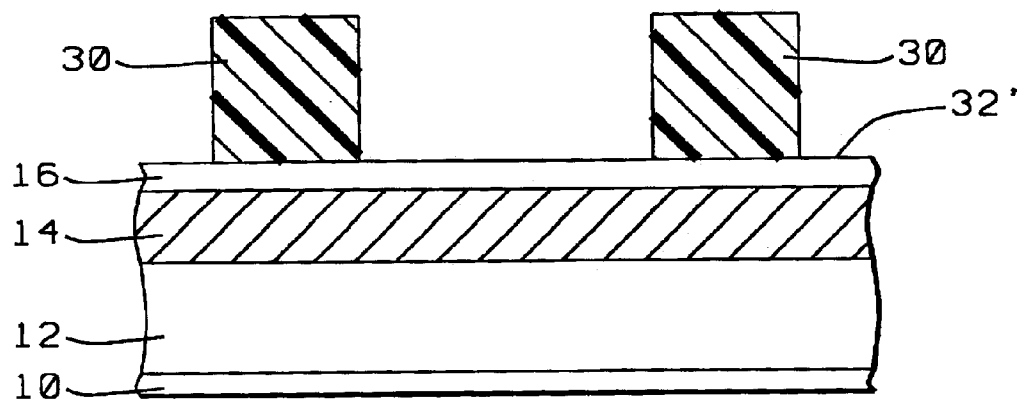

As shown in FIG. 3, second metal photoresist layer 30 is formed over the roughened surface 32' of ARC layer 16. Second metal photoresist layer 30 may be patterned as shown. The roughening of ARC layer 16 surface 32 to form roughened ARC layer surface 32' dramatically improves the adhesion of second patterned metal photoresist layer 30 to ARC layer 16 and thus reduces the problem of second patterned photoresist layer 30 from lifting off causing metal shorts and loss of yield.

Experimental Results

FIG. 4 illustrates the results of sets of three wafers with 0.18 logic devices reworked in accordance with the additional ARC layer 16 surface 32 roughening step of the present invention (A (1–3), B (4–6) and C (7–9)) as compared to reworking without the ARC layer 16 surface 32 roughening step of the present invention (D (14–16) and E (17–19)) showing the yield tile percent for each wafer.

As shown, the average yield tile % for the three sets of wafer reworking with the roughening step of the present invention are:

| Split Condition | Average Yield Tile % |
|---|---|
| Present Invention Roughening | |
| A<br>PRS + Mattson (90° C.) + DIW + N$_2$O Treatment (20") | 97.47% |
| B<br>PRS + Mattson (90° C.) + DIW + N$_2$O Treatment (40") | 97.47% |
| C<br>PRS + Mattson (90° C.) + DIW + N$_2$O Treatment (60") | 96.83% |
| Without Roughening | |
| D<br>PR Wash + Mattson (90° C.) + PRS | 40.2% |
| E<br>PRS + Mattson (90° C.) + DIW | 83.0% |

As demonstrated, using the additional ARC layer 16 surface 32 roughening step of the present invention dramatically increases the yield tile % after reworking.

Advantages of the Present Invention

The advantages of the present invention include:

(1) improved adhesion between the second photoresist layer and the ARC layer;

(2) reduced second photoresist layer peeling;

(3) reduced metal shorting; and (4) improved yields.

While particular embodiments of the present invention have been illustrated and described, it is not intended to limit the invention, except as defined by the following claims.

We claim:

1. A method of improving photoresist adhesion in a reworked device, including the steps of:

providing a semiconductor structure having an upper exposed metal layer;

forming an ARC layer over the upper exposed metal layer; the ARC layer having an upper surface;

forming a first photoresist layer upon the ARC layer;

removing the first photoresist layer by a rework process;

roughening the ARC layer upper surface to form a roughened ARC layer upper surface; and forming a second photoresist layer upon the roughened ARC layer upper surface whereby adhesion of the second photoresist layer to the ARC layer is improved.

2. The method of claim 1, wherein the exposed metal layer is composed of a material selected from the group consisting of copper, aluminum, Ti and TiN; and the ARC layer is composed of a material selected from the group consisting of SiON, SiN, TiN and SiO$_2$.

3. The method of claim 1, wherein the ARC layer is composed of SiON.

4. The method of claim 1, wherein the rework process includes employing:

a solvent treatment;

a plasma dry ashing treatment; and a deionized water treatment.

5. The method of claim 1, wherein the rework process includes employing:

a solvent treatment using a PRS tool;

a plasma dry ashing treatment at a temperature of about 90° C. using an asher; and a deionized water treatment.

6. The method of claim 1, wherein roughening the ARC layer upper surface employs:
an $N_2O$ gas flow of from about 500 to 3000 sccm;
a temperature of from about 350 to 450° C.;
a pressure of from about 1 to 15 Torr; and
a time of from about 20 to 100 seconds.

7. The method of claim 1, wherein roughening the ARC layer upper surface employs:
an $N_2O$ gas flow of from about 1200 to 2000 sccm;
a temperature of from about 380 to 420° C.;
a pressure of from about 2 to 8 Torr; and
a time of from about 20 to 60 seconds.

8. The method of claim 1, wherein the ARC layer has a thickness of from about 100 to 1000 Å.

9. The method of claim 1, wherein the ARC layer has a thickness of from about 200 to 600 Å.

10. The method of claim 1, including the step of forming a dielectric layer over the semiconductor structure interposed between the semiconductor structure and the metal layer.

11. The method of claim 1, including the step of forming a dielectric oxide layer over the semiconductor structure interposed between the semiconductor structure and the metal layer.

12. A method of improving photoresist adhesion in a reworked device, including the steps of:
providing a semiconductor structure having an upper dielectric layer;
forming an exposed metal layer over the upper dielectric layer;
forming an ARC layer over the upper exposed metal layer; the ARC layer having an upper surface;
forming a first photoresist layer upon the ARC layer;
removing the first photoresist layer by a rework process;
roughening the ARC layer upper surface to form a roughened ARC layer upper surface; and
forming a second photoresist layer upon the roughened ARC layer upper surface whereby adhesion of the second photoresist layer to the ARC layer is improved.

13. The method of claim 12, wherein the exposed metal layer is composed of a material selected from the group consisting of copper, aluminum, Ti and TiN; the dielectric layer is composed of oxide; and the ARC layer is composed of a material selected from the group consisting of SiON, SiN, TiN and $SiO_2$.

14. The method of claim 12, wherein the ARC layer is composed of SiON.

15. The method of claim 12, wherein the rework process includes employing:
a solvent treatment;
a plasma dry ashing treatment; and
a deionized water treatment.

16. The method of claim 12, wherein the rework process includes employing:
a solvent treatment using a PRS tool;
a plasma dry ashing treatment at a temperature of about 90° C. using an asher; and
a deionized water treatment.

17. The method of claim 12, wherein roughening the ARC layer upper surface employs:
an $N_2O$ gas flow of from about 500 to 3000 sccm;
a temperature of from about 350 to 450° C.;
a pressure of from about 1 to 15 Torr; and
a time of from about 20 to 100 seconds.

18. The method of claim 12, wherein roughening the ARC layer upper surface employs:
an $N_2O$ gas flow of from about 1200 to 2000 sccm;
a temperature of from about 380 to 420° C.;
a pressure of from about 2 to 8 Torr; and
a time of from about 20 to 60 seconds.

19. The method of claim 12, wherein the ARC layer has a thickness of from about 100 to 1000 Å.

20. The method of claim 12, wherein the ARC layer has a thickness of from about 200 to 600 Å.

21. A method of improving photoresist adhesion in a reworked device, including the steps of:
providing a semiconductor structure having an upper dielectric layer;
forming an exposed metal layer over the upper dielectric layer;
forming an ARC layer over the upper exposed metal layer; the ARC layer having an upper surface;
forming a first photoresist layer upon the ARC layer;
removing the first photoresist layer by a rework process;
roughening the ARC layer upper surface to form a roughened ARC layer upper surface; wherein the roughening the ARC layer upper surface employs:
an $N_2O$ gas flow of from about 500 to 3000 sccm;
a temperature of from about 350 to 450° C.;
a pressure of from about 1 to 15 Torr; and
a time of from about 20 to 100 seconds; and
forming a second photoresist layer upon the roughened ARC layer upper surface whereby adhesion of the second photoresist layer to the ARC layer is improved.

22. The method of claim 21, wherein the exposed metal layer is composed of a material selected from the group consisting of copper, aluminum, Ti and TiN; the dielectric layer is composed of oxide; and the ARC layer is composed of a material selected from the group consisting of SiON, SiN, TiN and $SiO_2$.

23. The method of claim 21, wherein the ARC layer is composed of SiON.

24. The method of claim 21, wherein the rework process includes employing:
a solvent treatment;
a plasma dry ashing treatment; and
a deionized water treatment.

25. The method of claim 21, wherein the rework process includes employing:
a solvent treatment using a PRS tool;
a plasma dry ashing treatment at a temperature of about 90° C. using an asher; and
a deionized water treatment.

26. The method of claim 21, wherein roughening the ARC layer upper surface employs:
an $N_2O$ gas flow of from about 1200 to 2000 sccm;
a temperature of from about 380 to 420° C.;
a pressure of from about 2 to 8 Torr; and
a time of from about 20 to 60 seconds.

27. The method of claim 21, wherein the ARC layer has a thickness of from about 100 to 1000 Å.

28. The method of claim 21, wherein the ARC layer has a thickness of from about 200 to 600 Å.

* * * * *

UNITED STATES PATENT AND TRADEMARK OFFICE
CERTIFICATE OF CORRECTION

PATENT NO. : 6,740,471 B1  Page 1 of 1
DATED : May 25, 2004
INVENTOR(S) : Gau-Ming Lu et al.

It is certified that error appears in the above-identified patent and that said Letters Patent is hereby corrected as shown below:

<u>Title page,</u>
Delete Item [76], and replace with Item:

-- [75] Inventors: Gau-Ming Lu, Taipei (TW); Dowson Jang, Tainan City (TW); Wen-Han Hung, Kaohsiung (TW); Yeong-Rong Chang, Tainan (TW) --.
Add Item:

-- [73] Assignee: Taiwan Semiconductor Manufacturing Company, Hsin-Chu (TW) --.

Signed and Sealed this

Sixteenth Day of November, 2004

JON W. DUDAS
*Director of the United States Patent and Trademark Office*